United States Patent [19]
McGill et al.

[11] Patent Number: 5,432,451
[45] Date of Patent: Jul. 11, 1995

[54] MAGNETIC RESONANCE IMAGING REFLECTOMETER TUNING UNIT

[75] Inventors: Robert E. McGill, Dix Hills; Robert P. Bisey, Seaford, both of N.Y.

[73] Assignee: Northrop Grumman Corporation, Los Angeles, Calif.

[21] Appl. No.: 216,164

[22] Filed: Mar. 22, 1994

[51] Int. Cl.$^6$ .............................................. G01V 3/00
[52] U.S. Cl. ..................................... 324/322; 324/318
[58] Field of Search ............... 324/322, 318, 307, 309, 324/314; 128/653.5

[56] References Cited

U.S. PATENT DOCUMENTS

| | | |
|---|---|---|
| 4,882,541 | 11/1989 | Haragashira .......................... 324/322 |
| 4,950,993 | 8/1990 | Encellaz et al. ....................... 324/322 |
| 5,172,061 | 12/1992 | Crooks et al. ......................... 324/322 |
| 5,208,537 | 5/1993 | Rietsch et al. ........................ 324/322 |
| 5,336,988 | 8/1994 | Chmielewski et al. .............. 324/322 |

*Primary Examiner*—Louis Arana
*Attorney, Agent, or Firm*—Terry J. Anderson; Karl J. Hoch, Jr.

[57] ABSTRACT

A reflectometer tuning unit for a magnetic resonance imaging (MRI) system, provided for the standing wave voltage adjustment of various MRI receive coil units, and which is also capable of detection of various open/short fault conditions in the MRI receive coil unit or the coaxial cable connected to the MRI receive coil unit. The reflectometer tuning unit comprises an oscillator, a directional coupler, and a measuring system. The oscillator produces an output signal having its frequency tuned to the Larmor frequency of the magnetic resonance imaging system. The directional coupler has OUT, IN and CPL ports. The output of the oscillator is connected to the OUT port, and selected impedances, and later the receive coil unit, are connected to the IN port. The directional coupler produces an output signal at the CPL port which is proportional to the port of energy reflected back from the IN port to the OUT port, which is also proportional to the impedance mismatch presented by the impedance at the IN port. The measuring system is connected to the CPL port of the directional coupler, and measures the magnitude of the output signal at the CPL port. The measuring system of the reflectometer tuning unit includes a rectifying detector connected to the CPL port of the directional coupler, which provides a DC voltage output. An amplifier is connected to the output of the rectifying detector, and an LED display is connected to the output of the amplifier.

21 Claims, 4 Drawing Sheets

MAGNETIC RESONANCE IMAGING REFLECTOMETER TUNING UNIT

BACKGROUND OF THE INVENTION

1. Field of the Invention

The present invention relates generally to a reflectometer tuning unit for a Magnetic Resonance Imaging (MRI) system, and more particularly pertains to a reflectometer tuning unit for a magnetic resonance imaging system, for adjusting and minimizing the standing wave voltage of an MRI receive coil unit.

Magnetic resonance imaging technology encompasses a wide spectrum of theoretical disciplines and practical equipment, the ultimate purpose of which is to achieve internal imaging of animate and inanimate objects through the monitoring of electromagnetic phenomenon, manifest at the nuclear level. In practice, MRI involves immersing the object under study in a high strength static magnetic field to align the magnetic spin of specific protons (primarily the protons of hydrogen atoms). In addition, a weak gradient magnetic field is applied to provide some spatial "tagging" on the object under study. At predetermined repetitive intervals, a strong pulse of radio frequency (RF) energy, at the MRI Larmor frequency, is transmitted by a set of coils whose field is orthogonal to the static electromagnetic field. The Larmor frequency of an MRI system is well known in the art, and is that characteristic frequency determined by the strength of the magnetic field and the species of element being excited. The Larmor frequency (F) is equal to the gyromagnetic constant ($\gamma$) of the material being excited times the strength of the magnetic field (B). In a typical hydrogen proton MRI system, $$F = \gamma B$$
$$F = \left[42.58 \frac{\text{MHz}}{T}\right][1.5\ T]$$
$$F = 63.88\ \text{MHz}$$

The perturbation caused by the pulse of RF energy causes a momentary upset in the magnetic spin of the nuclear species of the atoms within the object being imaged. Once the transmitted burst has subsided, these nuclear spins realign themselves to the influence of the original static magnetic field. The changing magnetic fields which result from this realignment induce various voltages in a receive coil which is placed in close proximity to the area of the object of interest prior to the imaging procedure. The signals picked up by the receive coil are then processed to ultimately produce high definition images of the object structures of interest.

The receive coil has evolved in design, from largely non-resonant broadband inductive pickup units, to coils which are designed to be sharply resonant at the Larmor frequency of the MRI system. Unlike broadband coils, resonant MRI receive coils possess the unique property of greatly improving the signal-to-noise ratio in the MRI signal processing chain, with concomitant improvement of MRI image quality and definition.

2. Discussion of the Prior Art

MRI is a well known technique wherein an object, animate or inanimate, which is placed in a spatially varying magnetic field is subjected to a pulse of Radio Frequency (RF) radiation, and the resulting nuclear magnetic resonance spectra are combined to give cross-sectional images of the object. The MRI technique is possible because the human body contains an abundance of hydrogen atoms, whose nuclei are protons, in its tissues, and these protons respond to electromagnetic manipulation, which is obviously essential in MRI. Generally, an MRI apparatus operates by the application of an RF excitation field in the presence of other magnetic fields, and by the subsequent sensing and analysis of the resulting nuclear magnetic resonance produced in the body.

Any nucleus which possesses a magnetic moment tends to align itself with the direction of the magnetic field in which it is located. Accordingly, when a substance such as human tissue is subjected to a static magnetic field, the individual magnetic moments of the protons in the tissue attempt to align with this polarizing magnetic field. However, the protons precess around the direction of the field at a characteristic angular frequency, known as the Larmor frequency, which is dependent on the strength of the magnetic field and the properties of the specific nuclear species. Once in the polarizing magnetic field, the alignments of the protons exist in one of two possible energy states which describe the spin angular momentum of the protons. Classically, the protons precess, that is, each proton's axis of rotation generally describes a cone and tends to turn at an angle relative to the direction of the applied polarizing magnetic field. The protons precess in a random order in terms of the phase of rotation. A net macroscopic magnetic moment is produced in the direction of the polarizing field, but the randomly orientated magnetic components in the perpendicular or transverse plane to the polarizing magnetic field cancel one another. If, however, the substance or tissue is subjected to an RF radiation pulse which is in the plane transverse to the polarizing magnetic field and which is at or near the Larmor frequency, the net aligned moment may be rotated or tipped into the transverse plane to produce a net transverse magnetic moment which is rotating or spinning in the transverse plane at or near the Larmor frequency. Essentially, the pulse of RF radiation is utilized to achieve resonance and produce a phase coherence such that the precessing protons are no longer random in phase, but rather at a single phase orientation. The degree to which the net magnetic moment is tipped, and hence the magnitude of the net transverse magnetic moment, depends primarily on the duration of time and the magnitude of the applied RF radiation signal.

The practical value of the above-described phenomenon resides in the signal which is emitted by the protons when the RF radiation pulse is terminated. Basically, a measurement is performed on the resonance signal emitted as feedback by the protons during the period when their magnetic moments tend to re-align themselves with the polarizing magnetic field. The measured signal is then processed in order to obtain therefrom cross-sectional images of the tissues or organs under examination. Essentially, as the protons are precessing and travelling back towards alignment within the polarizing magnetic field, they are "cutting" the plane of a receiving antenna which is part of the MRI device; accordingly, a current is induced in the receiving antenna in accordance with Faraday's Law. From this induced current signal, a map of the proton density of the tissue being imaged and its relaxation times, which is the time necessary for the protons to return to their unexcited condition, is generated. This feedback signal is processed and is ultimately transformed into a series of images of the tissue.

Various types of receiving antennas or coils have been designed for MRI applications. The most commonly utilized antenna is the standard sized whole body coil which is dimensioned to be disposed around the entire body of the patient to be imaged. Due to the standard sizing, a significant void or empty region may be defined between the coil and the portion of the patient to be imaged. As the imaged portion of the patient becomes a smaller fraction of the coil volume, the signal-to-noise ratio decreases, thereby degrading the image quality. In addition, the coil receives resonance signals from over a significantly larger area than the region of interest. This sensitivity to extraneous information degrades the spatial resolution. Accordingly, different size and shape receive coils are sometimes used in the prior art to minimize the above problems.

SUMMARY OF THE INVENTION

Accordingly, it is a primary object of the present invention to provide a reflectometer tuning unit for a magnetic resonance imaging system, for adjusting and minimizing the standing wave voltage of various MRI receive coil units.

A further object of the subject invention is the provision of a reflectometer tuning unit for a magnetic resonance imaging system provided for the automatic detection of various open/short fault conditions in the MRI receive coil unit or the coaxial cable connected to the MRI receive coil unit.

The subject invention relates to the tuning of resonant-type receive coils to the Larmor frequency. A portable hand-held tuning unit is temporarily connected to the receive coil unit prior to the imaging procedure. Its purpose is to indicate to operating personnel the real time resonance status of the receive coil as receive coil adjustment controls are adjusted to tune the coil to proper resonance.

The tuning unit allows the stand-alone MRI receiver coil to be tuned to resonance at the Larmor frequency. The tuning unit uses a calibrated LED display as an indicator of the degree of tuning of the receive coil to its proper resonance.

An MRI receive coil unit typically consists of a resonant Inductance-Capacitance (L-C) tank circuit and an impedance matching network. The resonant L-C tank circuit for MRI usually consists of a large coil of sufficient size to envelop or encompass the area of the object which is to be imaged. The coil is usually connected to a multiple capacitor arrangement so as to form a resonant L-C tank circuit which is tuned to the Larmor frequency by an impedance matching network which typically includes an adjustable capacitor to tune the network.

In accordance with the teachings herein, the present invention provides a reflectometer tuning unit for the standing wave voltage adjustment of a receive coil unit of a magnetic resonance imaging system. The reflectometer tuning unit comprises an oscillator, a directional coupler, and a measuring and indicating system. The oscillator produces an output signal whose frequency is tuned to the Larmor frequency of the magnetic resonance imaging system. The directional coupler has OUT, IN and CPL ports. The output of the oscillator is connected to the OUT port, and selected impedances, and later the receive coil unit, are connected to the IN port. The directional coupler produces an output signal at the CPL port which is proportional to the amount of energy reflected back from the IN port to the OUT port, which is also proportional to the impedance mismatch presented by the impedance at the IN port. The measuring system is connected to the CPL port of the directional coupler, and measures the magnitude of the output signal at the CPL port.

In greater detail, the measuring system of the reflectometer tuning unit includes a rectifying detector connected to the CPL port of the directional coupler, which provides a DC voltage output, which is a measure of the amount of energy reflected back from the IN port to the OUT port during operation of the reflectometer tuning unit, and is proportional to the impedance mismatch presented by the impedance at the IN port. An amplifier is connected to the output of the rectifying detector, and a display is connected to the output of the amplifier. The display preferably comprises an LED display which is not adversely affected by strong magnetic fields generated during operation of the magnetic resonance imaging system. The gain of the amplifier is controlled by an adjustable potentiometer, which adjusts the magnitude of the signal displayed by the display. The rectifying detector, which may comprise a diode detector, has a bias input connected to an adjustable potentiometer, which adjusts the magnitude of the minimum signal displayed by the display under a condition of minimal impedance mismatch by the impedance connected to the IN port. Moreover, an attenuator is preferably connected to the output of the oscillator, which may be a crystal oscillator, for buffering the oscillator from an impedance mismatch upon loading of the oscillator during operation of the reflectometer tuning unit. A rechargeable battery is preferably used as the power supply for the reflectometer tuning unit, to isolate and otherwise render the reflectometer tuning unit free from safety hazards of direct connection to the AC power supply for the magnetic resonance imaging system.

The present invention also provides a method of operating a reflectometer tuning unit as described hereinabove for the standing wave voltage adjustment of a receive coil unit, having an impedance matching network, of a magnetic resonance imaging system. The method of operation comprises connecting an open impedance to the IN port and measuring the impedance mismatch with the open impedance, and then connecting a short impedance to the IN port and measuring the impedance mismatch with the short impedance. The connection to the IN port is then configured as either an open impedance or a short impedance, whichever step produced the greatest impedance mismatch. The amplifier potentiometer is then adjusted to cause a given maximum reading on the LED display. A 50 ohm load termination is then connected to the IN port, and the rectifying detector potentiometer is adjusted to cause a given minimum reading on the display. The 50 ohm load termination is then removed from the IN port, and a receive coil unit is connected to the IN port. The reflectometer tuning unit is then operated with the receive coil unit connected thereto, and the impedance matching network of the reflectometer tuning unit is adjusted to cause a minimum reading on the display, which indicates a minimum impedance mismatch provided by the reflectometer tuning unit.

In a preferred method, the step of connecting an open impedance comprises connecting a first end of a coaxial cable to the IN port with a second end of the coaxial cable being unconnected. The step of connecting a short impedance comprises shorting the second end of the coaxial cable, and the step of connecting a 50 ohm load termination comprises connecting a 50 ohm load termination to the second end of the coaxial cable. The steps of adjusting the amplifier potentiometer and adjusting the rectifying detector potentiometer are interdependent, and so are iteratively repeated.

BRIEF DESCRIPTION OF THE DRAWINGS

The foregoing objects and advantages of the present invention for a magnetic resonance imaging reflectometer tuning unit may be more readily understood by one skilled in the art with reference being had to the following detailed description of several preferred embodiments thereof, taken in conjunction with the accompanying drawings wherein like elements are designated by identical reference numerals throughout the several views, and in which.

DETAILED DESCRIPTION OF THE DRAWINGS

Figure 1:
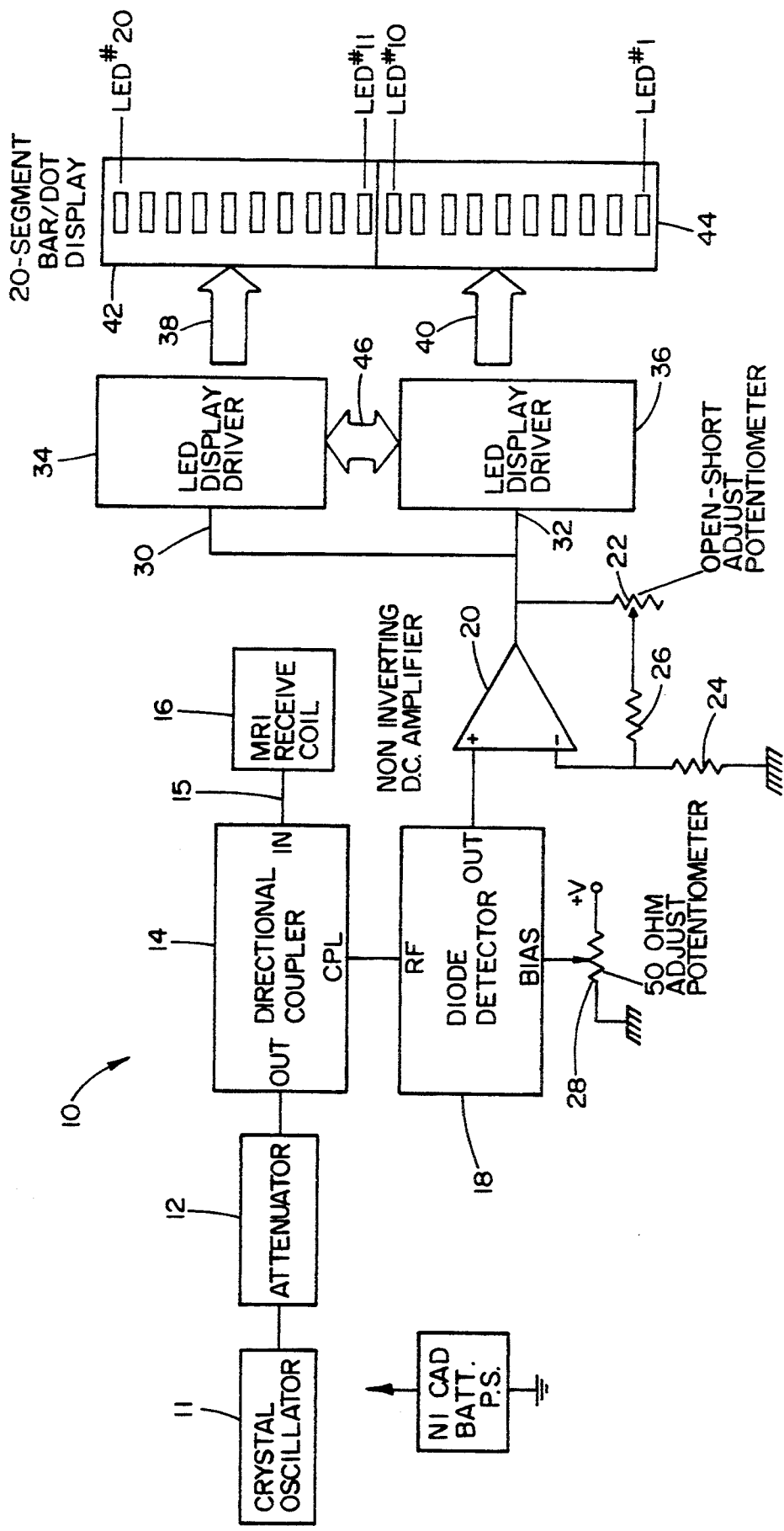
FIG. 1 is a block diagram of one embodiment of an MRI reflectometer tuning unit pursuant to the teachings of the present invention.

Referring to the drawings in detail, FIG. 1 is a functional block diagram of one embodiment of an MRI reflectometer tuning unit 10 pursuant to the teachings of the present invention. The tuning unit 10 consists of an oscillator, preferably a crystal oscillator 11, producing an output signal at the Larmor frequency. The output of the oscillator is connected to the input of an optional fixed attenuator 12, which essentially functions as a buffer to prevent detuning of the oscillator due to loading thereof during operation.

Figure 2:
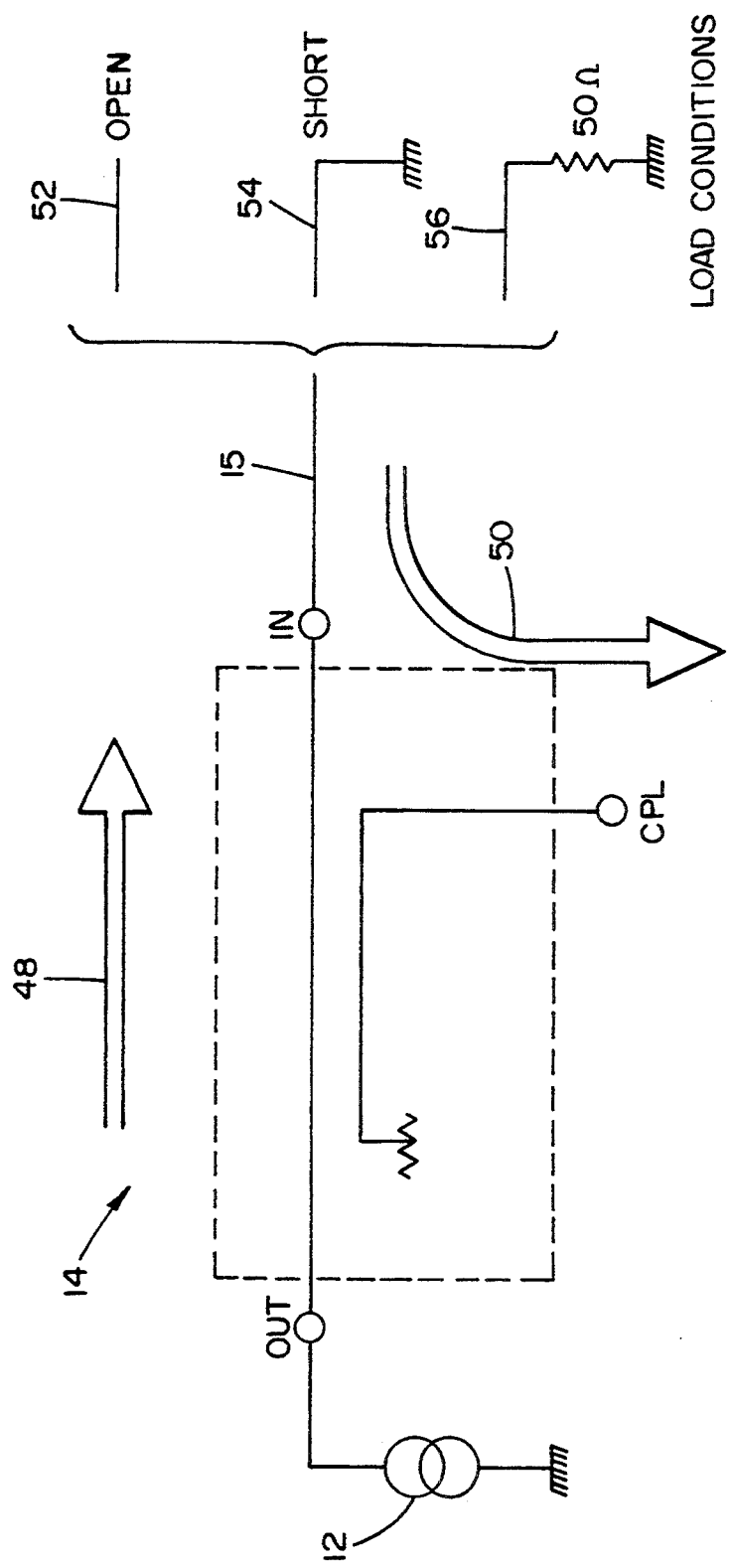
FIG. 2 is a functional drawing of the directional coupler of the MRI reflectometer tuning unit of FIG. 1.

The output of attenuator 12 is connected to the OUT terminal of a three port, radio frequency (RF) directional coupler 14, illustrated in further detail in FIG. 2. The IN port of the directional coupler is connected by a coaxial cable 15 to the MRI receive coil 16 which is to be tuned. Thus, by virtue of this signal path, RF energy from the crystal oscillator 11 is used to directly excite the MRI receive coil 16 at the MRI system Larmor frequency.

Figure 3:
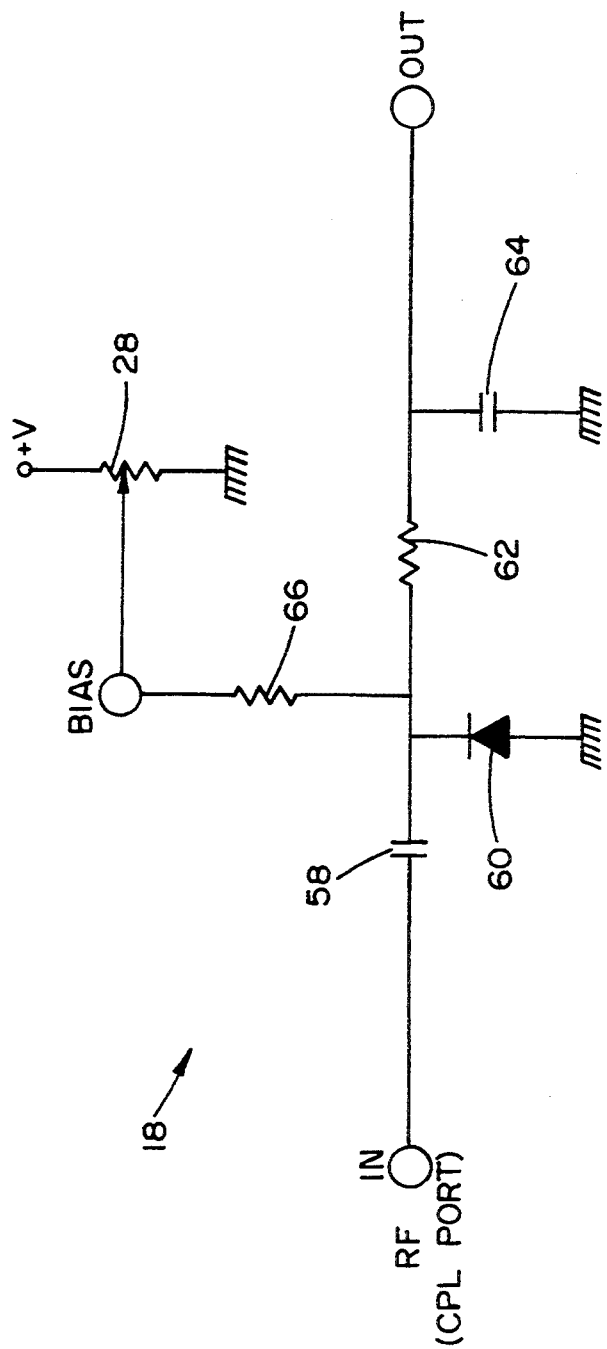
FIG. 3 is a schematic diagram of the diode detector of the MRI reflectometer tuning unit of FIG. 1.

The CPL output port of the directional coupler is connected to the input of a conventional RF diode detector 18, shown in further detail in FIG. 3, the output of which is connected to the input of a variable gain, non-inverting DC amplifier 20. The gain of the DC amplifier 20 is controlled by the setting of an OPEN-SHORT ADJUST potentiometer 22, which essentially adjusts the output of the amplifier such that a maximum impedance mismatch, as caused by an open or short circuit, results in a given or maximum reading on the LED display 42, 44, as described in further detail hereinbelow. Two additional resistors 24 and 26 are connected with potentiometer 22 to control the minimum gain and the overall gain range adjustment of the DC amplifier 20. The BIAS input of the diode detector 18 is connected to the wiper of a 50 OHM ADJUST potentiometer 28, which essentially adjusts the output to light only the first segment of the LED display 42, 44 when there is negligible impedance mismatch.

The output of the DC amplifier 20 drives the inputs 30 and 32 of two linear dot/bar display driver integrated circuits 34 and 36. The output of each display driver 34 and 36 is connected via signal paths 38 and 40 to the individual cathode connections of two LED display devices 42 and 44, each one of which contains ten LEDs.

Although each display driver 34 and 36 is designed to drive a maxima of ten LEDs per display 42 and 44, respectively, the display driver circuits are interconnected via signal paths 46 to produce a display which electronically combines each ten LED display to function as one continuous 20-LED display. Thus an increasing DC voltage of proper range, when applied to inputs 30 and 32, will cause the sequential illumination of each LED segment, beginning with LED segment #1 and continuing up through LED segment #20. In a practical embodiment of the present invention, each 10-LED display is physically mounted end-to-end with each other to produce the effect of having one continuous 20-LED display.

An LED display was selected for the present invention, as the reflectometer tuning unit operates in the environment of the MRI system, which produces very strong magnetic fields which would interfere with the operation of many other types of displays such as CRT or liquid crystal displays.

Moreover, the power supply for the reflectometer tuning unit is also a significant choice, and in one embodiment a rechargeable Ni—Cad battery power supply was selected. The power supply for the reflectometer tuning unit should be isolated from the building AC power supply, as the building AC power supply could possibly introduce a significant amount of noise into the reflectometer tuning unit, particularly during operation of the MRI system.

FIG. 2 is a schematic diagram outlining the general principles of operation of the directional coupler 14. The directional coupler 14 is a passive device which, when connected in a reflectometer mode, produces an RF signal at the CPL output port which is directly proportional to reflected energy caused by an impedance mismatch condition present at the output end of the coaxial cable. Generally, this type of directional coupler is used in either of two different modes of operation: first, in a sampler mode, to sample a portion of incoming RF energy from a generator for purposes of monitoring and/or automatic signal leveling via an automatic gain control circuit, or secondly, in a reflectometer mode, to monitor reflected energy from an improperly terminated or tuned load.

In the present invention, the directional coupler 14 is specifically used in the reflectometer mode, which requires somewhat backward couplings in that the signal source be connected to the OUT port, while the load is connected to the IN port of the coupler 14. The signal source is the output of attenuator 12 of FIG. 1, while the load is the coaxial cable 15 and the MRI receive coil unit 16 of FIG. 1. Signal flow arrow 48 shows the flow of RF energy from the OUT to the IN terminals of the coupler 14. In couplers of this type, nearly all but an insignificantly small amount of energy is transferred directly between these two ports with very little loss.

The CPL port is connected internally to coupler circuitry which samples and produces an RF output according to the direction of energy flow between the signal from 12 and the load 15, 16. Although the coupler circuitry responds very little to energy flow from the OUT to the IN port, indicated by arrow 48, the same circuitry responds dramatically to energy flow from the IN port back toward the OUT port, indicated by arrow 50. With reference to the bracketed LOAD CONDITIONS on the right side of FIG. 2, if the IN port is left open as at 52, or shorted as at 54, nearly all the energy transmitted in the direction indicated by arrow 48 is reflected back towards the OUT port. With these conditions, the CPL output delivers an RF signal which is typically −10 dBM below the level of the reflected power. When the IN port is terminated in a 50 ohm resistance 56, however, no energy is reflected back towards the OUT port, which subsequently produces an output RF level at the CPL port, typically −40 dBM or more down from the input signal from 12.

In the present invention, the directional coupler 14 functions to provide an output signal at the CPL port which is proportional to the reflected energy produced by various degrees of mistuning of the MRI receive coil 16, and accordingly the directional coupler 14 is a significant component of the present invention. When the coil 16 is not tuned to the Larmor crystal oscillator frequency, the reflected energy, manifested as a DC voltage at the coupler CPL port, is approximately proportional to the degree of mistuning of the coil from resonance. When the coil is tuned to resonance, however, there is minimal reflected energy, which results in a correspondingly low RF signal at the CPL output.

FIG. 3 illustrates a circuit diagram of the diode detector 18 of FIG. 1, which is essentially a rectifying circuit. RF energy, from the CPL port of the directional coupler 14 of FIG. 1, is applied to the IN port of FIG. 3. Capacitor 58 couples RF energy across germanium diode 60. With increasing RF input voltage, the diode 60 conducts current while the instantaneous input RF voltage is negative, but remains non-conducting when the instantaneous RF voltage is positive. This rectification action passes or translates the average value of the applied RF voltage in a positive direction. Resistor 62 and capacitor 64 form a low pass integrator which effectively short circuits the peak-to-peak RF voltage while allowing only the shifted average value of the same voltage waveform to pass directly to the detector OUT port.

Thus the OUT port delivers a DC voltage, analogous to the shifted average value of the RF waveform, which is proportional to the peak-to-peak amplitude of the applied RF input signal. Resistor 66 is a high value resistor which acts in conjunction with the output voltage produced by the 50 ohm ADJUST potentiometer 28, FIGS. 1 and 3, to inject a small biasing current at the junction of diode 60, resistor 62, and capacitor 58, which results in establishing a minimum voltage output at the OUT port of the detector. When the MRI receive coil is tuned to resonance, a minimal voltage appears at the RF input port of the detector. In this condition, it is desirable to pre-bias the detector output such that the #1 LED segment illuminates, which would result in a tuned, 50 ohm impedance indication. Without this injected voltage, no LED indicators would illuminate, thus giving an uncertain or ambiguous indication of the tuned status of the receive coil 16.

Figure 4:
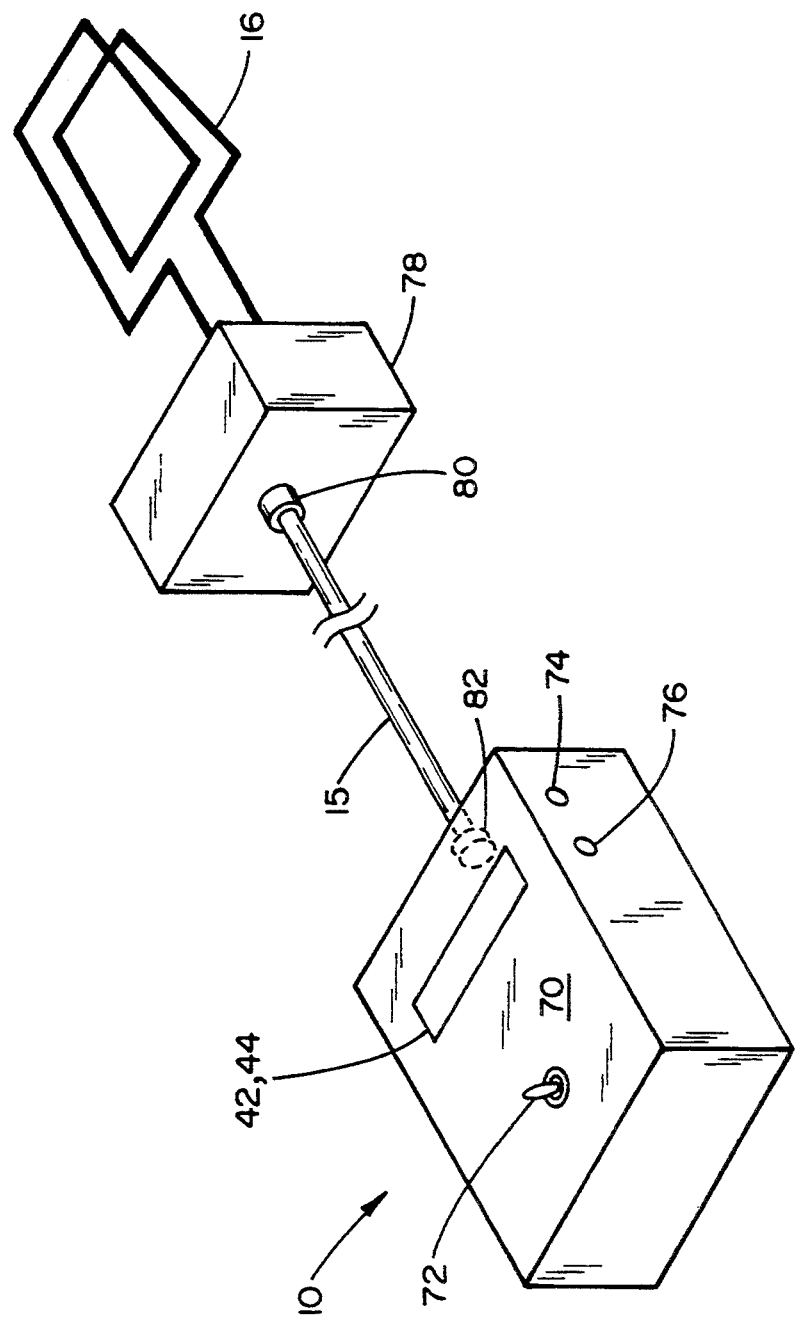
FIG. 4 is an isometric drawing of one embodiment of a reflectometer tuning unit pursuant to the present invention, showing its use in conjunction with a receive coil unit.

FIG. 4 illustrates a practical embodiment of the present invention, showing the reflectometer tuning unit 10 used in conjunction with a receive coil unit 16. The MRI tuning unit 10 is housed in a small hand-held case 70, which also mounts thereon the 20-LED display 42, 44 oriented in a horizontal axis, positioned with LED segment #1 to the left and LED segment #20 to the right. The tuning unit internal electronic circuitry is powered by a self-contained rechargeable battery, whose power connection to internal circuitry is controlled via a power on/off switch 72. Two screwdriver access holes 74 and 76 allow for the adjustment of the 50 ohm adjust potentiometer 28 and the open/short adjust potentiometer 22, respectively, during the initial coaxial cable compensation procedure. A coaxial cable 15 with a characteristic impedance of 50 ohms interconnects the tuning unit 10 with the receive coil 16 matching network 78 which, in turn, ultimately connects to the receive coil 16. The coaxial cable 15 interfaces with the tuning unit 10 and the impedance matching network 78 via a coaxial connector 80 on the matching network side 78, and a coaxial connector 82 on the tuning meter side, as shown in FIG. 4.

When using the present invention, the MRI technician first connects the end of a coaxial cable 15, which normally connects to the input of the MRI imaging electronics system, to the coaxial connector 82 of the reflectometer tuning unit. At this time the technician also disconnects and leaves open the other end of the cable 15 which normally connects to the receive coil unit 16, thus creating an open circuit condition 52, FIG. 2. The technician then adjusts the open/short adjustment potentiometer 22 to cause an LED segment to illuminate at approximately mid scale in the horizontal span of the LED display. Next, the technician connects a shorted termination to the imaging coil end of the coaxial cable, thus creating a short circuit condition 54, FIG. 2, and observes which of the two conditions, i.e., an open or shorted termination, produces the highest segment illumination towards the right hand side of the LED display, although they are normally the same.

The technician then selects and configures the receive coil unit end of the cable to produce the highest reading, i.e., a shorted or open termination. Once configured, the technician then readjusts the open/short potentiometer 22 to cause LED segment #20 to illuminate. Next, the technician then removes the short (if used), and connects to the open end (if used) a 50 ohm load termination 56, FIG. 2. At this point, the 50 ohm calibrate potentiometer 28 is adjusted until display LED segment #1 illuminates.

Because the open/short and the 50 ohm adjustments tend to be interactive, preferably an iterative procedure is used in which the initial open/short coaxial cable configuration is restored and the open/short potentiometer readjusted as needed to make LED segment #20 illuminate. Finally, the 50 ohm load 56 is reapplied to the cable and the 50 ohm calibrate potentiometer 28 is adjusted one last time to make LED segment #1 illuminate.

At this time, the calibration of the reflectometer tuning unit is completed. This calibration is usually only performed during routine, periodic maintenance of the tuning unit. The 50 ohm load termination 56 is now removed from the cable and this end of the cable is subsequently attached to the receive coil unit 16. At this time, tuning adjustments are made to the matching network/receive coil circuitry (usually adjustment of a variable capacitor, although a variable inductor could also be used) to eventually cause the illuminated LED segment to shift to the left, toward LED segment #1;

when LED segment #1 illuminates, this signifies perfect tuning of the receive coil unit 16 to the Larmor frequency, as provided by the reflectometer tuning unit internal crystal oscillator 11. Once final tuning is achieved in this manner, the coaxial cable 15 is disconnected from the tuning unit 10 and finally reattached to the MRI electronics system. At this point, an MRI imaging procedure can now be performed.

The calibration of the reflectometer tuning meter and the subsequent calibration of the receive coil unit by the impedance matching network also tests the coaxial cable and the receive coil unit for faults such as short or open circuits, as any such faults will quickly become apparent by unexpected LED display readings during the above calibration procedures.

While several embodiments and variations of the present invention for a magnetic resonance imaging reflectometer tuning unit are described in detail herein, it should be apparent that the disclosure and teachings of the present invention will suggest many alternative designs to those skilled in the art.

What is claimed is:

1. A reflectometer tuning unit for the standing wave voltage adjustment of a receive coil unit of a magnetic resonance imaging system, comprising:
   a. an oscillator having an output frequency tuned to the Larmor frequency of the magnetic resonance imaging system;
   b. a directional coupler having OUT, IN and CPL ports, with the output of said oscillator being connected to said OUT port, and the receive coil unit being connected to said IN port, wherein said directional coupler provides an output signal at the CPL port which is proportional to the amount of energy reflected back from said IN port to said OUT port, which is proportional to the impedance mismatch presented by the impedance at said IN port; and
   c. means, connected to the CPL port of the directional coupler, for measuring the output signal at the CPL port, which is a measure of the amount of energy reflected back from said IN port to said OUT port during operation of the reflectometer tuning unit and is proportional to the impedance mismatch presented by the impedance at said IN port.

2. A reflectometer tuning unit as claimed in claim 1, wherein said measuring means includes:
   a. a rectifying detector, connected to said CPL port of the directional coupler, which provides a DC voltage output;
   b. an amplifier connected to the output of said rectifying detector; and
   c. a display connected to the output of said amplifier.

3. A reflectometer tuning unit as claimed in claim 2, wherein said display comprises an LED display which is not adversely affected by strong magnetic fields generated during operation of the magnetic resonance imaging system.

4. A reflectometer tuning unit as claimed in claim 2, wherein the gain of said amplifier is controlled by an adjustable potentiometer, which adjusts the magnitude of the signal displayed by said display.

5. A reflectometer tuning unit as claimed in claim 2, wherein said rectifying detector has a bias input connected to an adjustable potentiometer, which adjusts the magnitude of the minimum signal displayed by said display under a condition of minimal impedance mismatch by the impedance connected to said IN port.

6. A reflectometer tuning unit as claimed in claim 2, wherein said rectifying detector comprises a diode detector.

7. A reflectometer tuning unit as claimed in claim 1, further including an attenuator connected to the output of said oscillator, for buffering the oscillator from an impedance mismatch upon loading of the oscillator during operation of the reflectometer tuning unit.

8. A reflectometer tuning unit as claimed in claim 1, wherein said oscillator is a crystal oscillator.

9. A reflectometer tuning unit as claimed in claim 1, further including a rechargeable battery as the power supply for the reflectometer tuning unit, to isolate the reflectometer tuning unit from noise in the AC power supply for the magnetic resonance imaging system.

10. A reflectometer tuning unit as claimed in claim 2, wherein said oscillator is a crystal oscillator.

11. A reflectometer tuning unit as claimed in claim 10, wherein said display comprises an LED display which is not adversely affected by strong magnetic fields generated during operation of the magnetic resonance imaging system.

12. A reflectometer tuning unit as claimed in claim 11, further including a rechargeable battery as the power supply for the reflectometer tuning unit, to isolate the reflectometer from noise in the AC power supply for the magnetic resonance imaging system.

13. A reflectometer tuning unit as claimed in claim 12, wherein the gain of said amplifier is controlled by an adjustable potentiometer, which adjusts the magnitude of the signal displayed by said display.

14. A reflectometer tuning unit as claimed in claim 13, wherein said rectifying detector has a bias input connected to an adjustable potentiometer, which adjusts the magnitude of the minimum signal displayed by said display under a condition of minimal impedance mismatch by the impedance connected to said IN port.

15. A reflectometer tuning unit as claimed in claim 14, wherein said rectifying detector comprises a diode detector.

16. A reflectometer tuning unit as claimed in claim 15, further including an attenuator connected to the output of said oscillator, for buffering the oscillator from an impedance mismatch upon loading of the oscillator during operation of the reflectometer tuning unit.

17. A method of operating a reflectometer tuning unit for the standing wave voltage adjustment of a receive coil unit, having an impedance matching network, of a magnetic resonance imaging system, comprising: an oscillator having an output frequency tuned to the Larmor frequency of the magnetic resonance imaging system; a directional coupler having OUT, IN and CPL ports, with the output of said oscillator being connected to said OUT port, wherein said directional coupler provides an output signal at the CPL port which is proportional to the amount of energy reflected back from said IN port to said OUT port and the impedance mismatch presented by the impedance at said IN port; a rectifying detector connected to said CPL port of the directional coupler; an amplifier connected to the output of said rectifying detector; and a display connected to the output of said amplifier; wherein the gain of said amplifier is controlled by an adjustable potentiometer, which adjusts the magnitude of the signal displayed by said display, and said rectifying detector has a bias input connected to an adjustable potentiometer, which adjusts the magnitude of a minimum signal displayed by said display under a condition of minimal impedance mismatch by the impedance connected to said IN port, said method of operating comprising:

a. connecting an open impedance to said IN port and measuring the impedance mismatch with the open impedance;

b. connecting a short impedance to said IN port and measuring the impedance mismatch with the short impedance;

c. configuring the connection to said IN port in either step a or step b, whichever step produced the greatest impedance mismatch;

d. adjusting said amplifier potentiometer to cause a given maximum reading on said display;

e. connecting a 50 ohm load termination to said IN port;

f. adjusting said rectifying detector potentiometer to cause a given minimum reading on said display;

g. removing the 50 ohm load termination from said IN port, and connecting a receive coil unit to said IN port;

h. operating the reflectometer tuning unit with the receive coil unit connected thereto, and adjusting the impedance matching network of the reflectometer tuning unit to cause a minimum reading on said display, which indicates a minimum impedance mismatch provided by the reflectometer tuning unit.

18. A method as in claim 17, wherein said step of connecting an open impedance comprises connecting a first end of a coaxial cable to said IN port with a second end of the coaxial cable being unconnected.

19. A method as in claim 18, wherein said step of connecting a short impedance comprises shorting the second end of said coaxial cable.

20. A method as in claim 19, wherein said step of connecting a 50 ohm load termination comprises connecting a 50 ohm load termination to the second end of the coaxial cable.

21. A method as in claim 17, wherein steps d and e are repeated again.

* * * * *